United States Patent [19]

Hisa

[11] Patent Number: 4,994,876
[45] Date of Patent: Feb. 19, 1991

[54] LIGHT DETECTING ELEMENT AND LIGHT DETECTING ARRAY

[75] Inventor: Yoshihiro Hisa, Itami, Japan

[73] Assignee: Mitsubishi Denki Kabushiki Kaisha, Japan

[21] Appl. No.: 398,956

[22] Filed: Aug. 28, 1989

[30] Foreign Application Priority Data

Aug. 31, 1988 [JP] Japan .................................. 63-217624

[51] Int. Cl.[5] .................... H01L 29/78; H01L 27/14; H01L 31/00
[52] U.S. Cl. ......................................... 357/24; 357/30
[58] Field of Search ................. 357/24, 30; 377/57-63

[56] References Cited

U.S. PATENT DOCUMENTS

| 4,104,674 | 8/1978 | Lorenz et al | 357/24 |
| 4,467,340 | 8/1984 | Rode et al. | 357/24 |
| 4,614,960 | 9/1986 | Bluzer | 357/24 |
| 4,660,066 | 4/1987 | Reid | 357/24 |
| 4,737,833 | 4/1988 | Tabei | 357/24 |
| 4,851,887 | 7/1989 | Hagiwara | 357/24 |
| 4,912,560 | 3/1990 | Osawa | 357/24 |

OTHER PUBLICATIONS

Kuen Chow, "Hybrid Infrared Focal-Plane Arrays", IEEE Transactions on Electron Devices, vol. ED-29, No. 1, Jan. 1982, pp. 3-13.

Primary Examiner—Gene M. Munson
Attorney, Agent, or Firm—Leydig, Voit & Mayer

[57] ABSTRACT

An infrared light detecting element which may be employed in a two-dimensional light detecting array includes a light responsive photodiode that generates electrical charges in response to incident light. The electrical charges are conveyed to a charge storage means and subsequently transferred to a charge coupled device. The charges are stored in potential wells produced opposite electrodes in a laminated structure including a semiconductor substrate on which one charge storage electrode is disposed and a first semiconductor layer disposed on the substrate on which a second charge storage electrode is disposed. The charge storage electrodes are interconnected in series or in parallel. Additional semiconductor layers and charge storage electrodes may be employed. The laminated structure produces a significant increase in the charge storage capacity of the device without increasing its area. The dynamic range of the charge storage capacity and signal-to-noise ratio of the element and the array are significantly improved over the prior art.

39 Claims, 12 Drawing Sheets

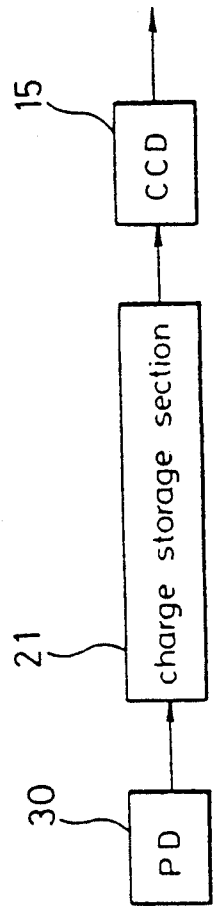
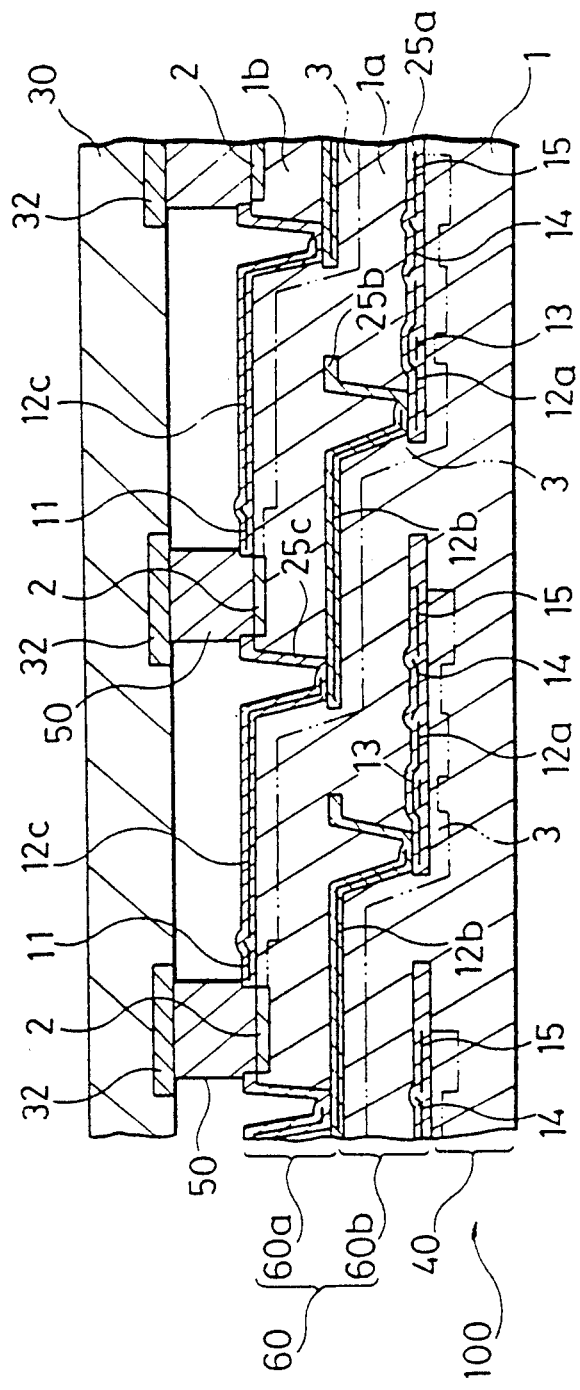
FIG 1(a)
FIG 1(b)

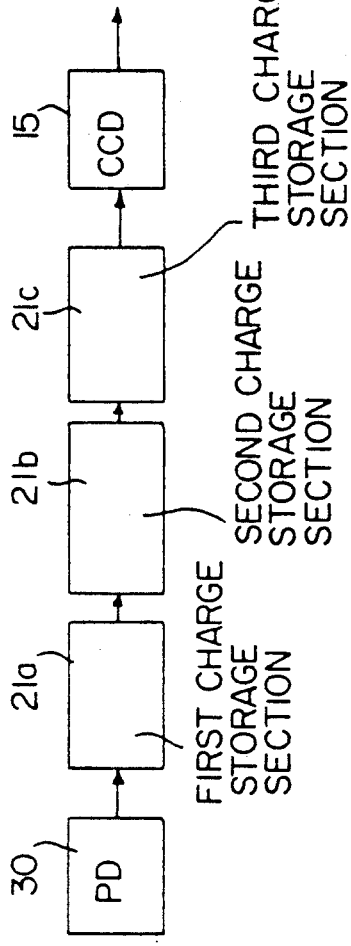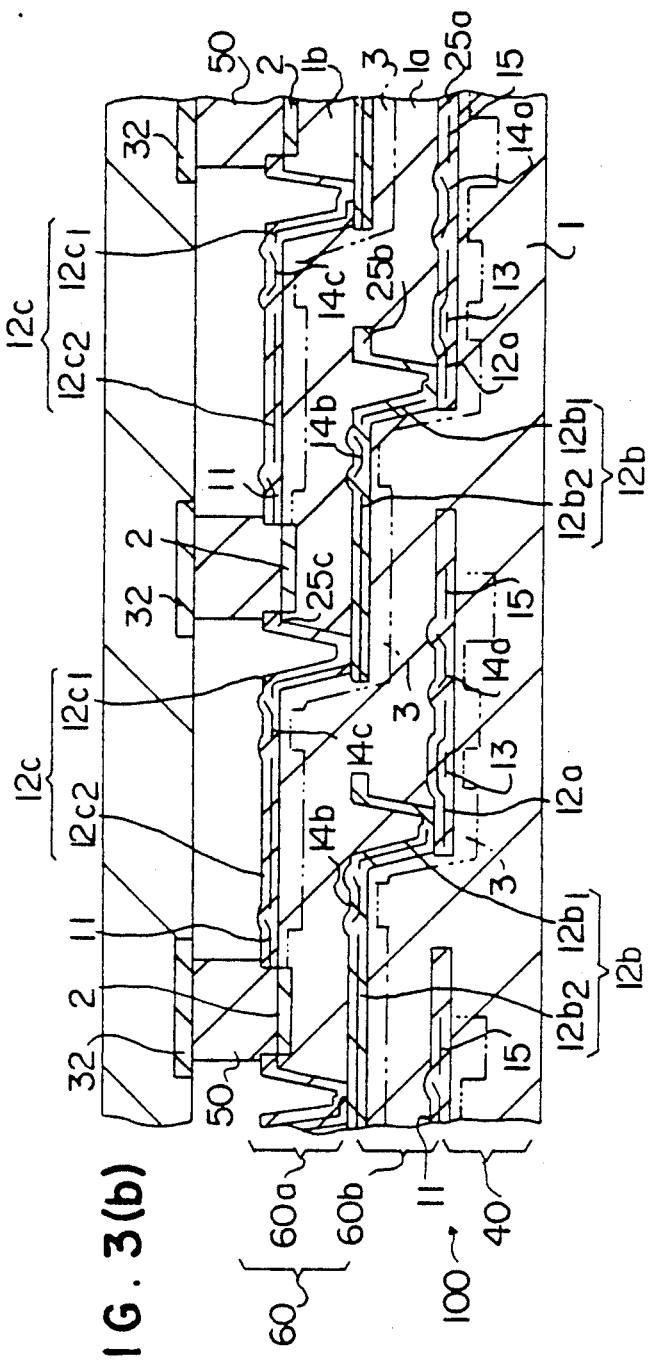

LIGHT DETECTING ELEMENT AND LIGHT DETECTING ARRAY

FIELD OF THE INVENTION

The present invention relates to a light detecting element and a two-dimensional integrated light detecting array employing a plurality of the elements, particular for infrared light detection.

BACKGROUND OF THE INVENTION

FIG. 5 shows, in cross-section, a conventional hybrid infrared detecting array. Semiconductor substrate 1 contains signal processing circuitry. A p-type semiconductor substrate 30 includes photodetecting elements for converting incident infrared light into electrical charges, i.e., electrical signals. Spaced apart n-type regions 32 are formed in the substrate 30 by diffusion, establishing pn junction photodiodes between the substrate 30 and the regions 32. Semiconductor substrate 1 may be silicon or gallium arsenide containing signal processing circuitry 31. The signal processing circuitry 31 includes circuitry for storing the electrical charges, i.e., the signal charges, produced by the photodiodes in response to incident infrared light, and charges, such as a charge coupled device (CCD), to external circuitry. A plurality of electrodes 50 are disposed between and join the substrates 1 and 30, electrically interconnecting the photodiodes and the signal processing circuitry 31.

Infrared detectors, particularly those having a desired response in the 10 micron wavelength band, e.g., 8 to 10.5 microns, exhibit particular technical problems. A consistent problem is the presence of relatively high intensity background radiation, meaning that the desired signal or image, in the case of a two-dimensional array, has low contrast and the suppression of noise must be given particular attention.

Black body radiation at a temperature of 300° K. has an intensity versus wavelength distribution as shown in FIG. 6(a). That distribution, i.e., the background, includes a peak at wavelengths around 10 microns resulting from a combination of the energy and quantity distributions of photons as a function of wavelength.

The energy of a photon and its wavelength are related by:

$$E = 1.24/\lambda$$

where E is the energy of the photon in electron volts (eV) and $\lambda$ is the wavelength of the photon in microns. The relative quantity of photons produced by the radiating black body is related to photon energy by:

$$N = I/E$$

where I is the energy of the incident light in electron volts (eV), N is the number of photons in the incident light, and E is the energy of the photons in electron volts (eV). While the energy of a photon having a wavelength of 3 to 5 microns is larger than the energy of a photon having a wavelength from 8 to 10.5 microns, the quantity of photons emitted from a black body at 300° K. having wavelengths from 8 to 10.5 microns is larger than the number of photons emitted with wavelengths from 3 to 5 microns. For example, the flux of photons having wavelengths from 8 to 10.5 microns radiated by a black body at 300° K. is about $3.6 \times 10^{17}$ photons/cm²s, about thirty times as many photons as are radiated in the 3 to 5 micron wavelength range. Thus, the peak intensity of infrared radiation from a black body at 300° K. occurs at about a 10 micron wavelength.

These wavelength-sensitive intensity differences mean that the contrast of an infrared signal or image being sensed, that is, the ratio of the signal component S to the background signal B of the incident rays in the 8 to 10.5 micron wavelength band (FIG. 6(c)) is smaller than that in the 3 to 5 micron wavelength band (FIG. 6(b)) at 300° K. Quantitatively, the contrast of an infrared signal or image in the 8 to 10.5 micron wavelength band is about one-half of that of an image in the 3 to 5 micron wavelength band. To improve the signal-to-noise ratio in the 8 to 10.5 micron wavelength, "charge skimming" is employed.

A hybrid infrared detector employing the charge skimming method is described in "Hybrid Infrared Focal-Plane Arrays" by Chow et al, Volume ED-29, Number 1, January, 1982, of the *IEEE Transactions on Electron Devices*. FIGS. 7(a) and 7(b) schematically show the charge transfer potential well structure of a light detecting element and a schematic geometric structure of a two-dimensional infrared detector array, respectively, of the types described by Chow et al. In FIG. 7(a), a p-type semiconductor substrate 100 includes signal processing circuitry. An n+-type connection region 2 is disposed in the substrate 100. A photodiode 20 for detecting incident infrared light includes a cathode, i.e, an n-type region, connected with the n+-type region 2, and an anode, i.e., a p-type region that is grounded.

A charge storage electrode 12, $V_{STORE}$, produces a potential well 3 for storing signal charges in the p-type semiconductor substrate 100. A gate electrode 11, $V_T$, controls the introduction of the signal charges from the photodiode 20 into the potential well 3. A dividing electrode 13, $V_{PART}$, divides the potential well 3 and the signal charges stored in the potential well 3 into potential well parts 3a and 3b containing the divided charges. A skimming electrode 14, $V_{SKIM}$, controls the transfer of charges from the potential well part 3b to a potential well 4. A CCD electrode 15 produces the potential well 4 and supplies the signal charges stored in that well 4 to a CCD. A field effect transistor (FET) 5 empties charges from potential well 3, resetting the circuitry, and includes a gate electrode 16, $V_{BLOOM}$, and a drain electrode 17, $V_{DRAIN}$.

In FIG. 7(b), a two-dimensional array of photodetectors and the associated signal processing circuity of the type forming the light detecting element illustrated in FIG. 7(a) is schematically shown. In FIGS. 7(a) and 7(b) and in all other figures, the same elements are given the same reference numbers. FIG. 7(b) includes a two-dimensional 5 by 5 array of light detecting elements. The array includes five columns of light detecting elements with five light detecting elements in each column. Charges from the elements in each column are transferred along separate columns of CCDs and are ultimately collected in a single row 36 of CCDs. The CCDs in row 36 pass the collected signal along to extenral circuitry so that a two-dimensional detected image can be represented by the collected charges.

The operation of the signal processing circuitry of FIG. 7(a) is illustrated in FIGS. 9(a) through 9(d). In the initial state, a relatively high voltage is applied to the storage electrode 12 to produce the potential well 3 in the substrate 100 opposite the electrode 12. A still higher voltage is next applied to the gate electrode 11 to produce an inversion layer at the surface of the substrate 100 opposite the gate electrode 11. The inversion layer forms a conducting channel so that signal charges generated by the photodiode 20 flow from n+-type connection region 2 into the charge storage potential well 3 and are stored there, as illustrated in FIG. 9(b).

Subsequently, a relatively low voltage is applied to the dividing electrode 13, dividing the potential well 3 into parts 3a and 3b. The charges stored in the potential well 3 are also separated into two parts by the division of the well 3. Some of the charges remain in the well part 3a and others are stored in the well part 3b. Without the division of stored signal charges, the quantity of charges from potential well 3 might exceed the storage capacity of and overflow the potential well 4 of the CCD when transferred from the well 3. By dividing the potential well 3 and the charges stored in it, only charges from the charge storage well part 3b are transferred into the potential well 4, as indicated in FIG. 9(c).

In order to transfer the charges from the potential well part 3b to the potential well 4, a relatively high voltage is applied to the skimming electrode 14. The charges in the potential well part 3b having energies exceeding the potential barrier between the potential well part 3b and the potential well 4 flow into the potential well 4 opposite the CCD electrode 15. The height of that potential barrier is controlled by the voltage applied to the skimming electrode 14 relative to the voltages on the electrodes 12 and 15. Thus, the signal is "skimmed" so that only the signal charges representing a desired image and a portion of the background reach the potential well 4. This charge flow is illustrated in FIG. 9(d).

Finally, a relatively high voltage is applied to the dividing electrode 13 to remove the potential barrier between the well parts 3a and 3b. Then, a voltage is applied to the gate electrode 16 to turn on FET 5 and thereby drain the remaining charges from the potential well 3 via the drain electrode 17.

The charge storage capacity of the prior art infrared detector described cannot be increased easily. Generally, in order to enhance the signal-to-noise ratio it is only necessary to increase the integration time, i.e., the time during which charges from the photodetector 20 are collected before their transfer from n+-type region 2 to the potential well 4. The signal-to-noise ratio is improved in proportion to the square root of the integration time. FIG. 8(b) shows a comparison between the amount of charge stored during a short integration time, example A, and a long integration time, example B. Although a longer integration time provides improved results, in the conventional detectors the charge storage capacity of the wells can be increased only by increasing the area of the electrodes, i.e., the size of the circuitry on the substrate. Increased substrate circuitry size is undesirable because substrate area is limited. In addition, image resolution is decreased when the electrode area is increased because the area available for photodiodes is reduced so that the density of the photodiodes is reduced.

A structure like that schematically shown in FIG. 10 could be adopted for hybrid infrared detector arrays. In FIG. 10, the substrate 100 has a larger size on the signal processing circuitry side than the photoelectric conversion substrate 30. The substrates 30 and 100 are electrically connected with each other by connecting electrodes 50. However, the connecting electrodes 50 are required to be obliquely disposed relative to the substrates because of the different sizes of the substrates, making their production quite difficult. Moreover, by enlarging the signal processing circuitry substrate 100, the charge transfer distances in the charge transfer circuitry are increased, limiting the speed of operation.

SUMMARY OF THE INVENTION

An object of the invention is to provide a light detecting element having increased storage capacity without increased substrate size.

According to the present invention, a light detecting element includes a light responsive device for generating electrical charges in response to incident light and circuitry for conveying, storing, and transferring the charges to a CCD electrode. The charge storage structure is laminated, i.e., layered, including a semiconductor substrate on which a first charge storage electrode and charge transfer electrodes are disposed and a first semiconductor layer disposed on the substrate, a second charge storage electrode being disposed on the layer opposite the substrate and interconnected through the layer to the first charge storage electrode. The light detecting element may be responsive to infrared light. The light responsive device is preferably spaced from the circuitry. A two-dimensional light detecting array includes at least two interconnected columns, each including at least two of the light detecting elements for forming a two-dimensional image of a radiating body. The light detecting elements in each column are connected to a common column CCD that transfers collected charges to a row CCD that is interconnected with the column CCDs.

In the invention, it is possible to increase the charge storage capacity of the light detecting element without increasing the substrate size because of the three-dimensional, i.e., laminated, arrangement of the charge storage electrodes. The configuration constraints on the charge storage elements in the charge transfer section are also relaxed so that the configuration of the array can be optimized for high speed operation.

It is possible to increase, simply and arbitrarily, the charge storage of elements and arrays according to the invention capacity by increasing the number of layers of the charge storage electrodes to three or more without reducing the area occupied by other parts of the array, such as the photodiodes and the charge transfer electrodes. The number of layers of electrodes is increased by adding additional semiconductor layers with a charge storage electrode disposed between adjacent layers. These electrodes are interconnected serially or in parallel.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

BRIEF DESCRIPTION OF THE DRAWINGS

FIG. 1(a) is a block diagram illustrating a light detecting element according to an embodiment of the present invention, FIG. 1(b) is a sectional view of a representative portion of the light detecting elements in the embodiment of FIG. 1(a)

FIG. 3(a) is a block diagram illustrating another embodiment of the present invention, and FIG. 3(b) is a sectional view of a representative portion of the embodiment of FIG. 3(a).

DETAILED DESCRIPTION OF PREFERRED EMBODIMENTS

Figure 1C:
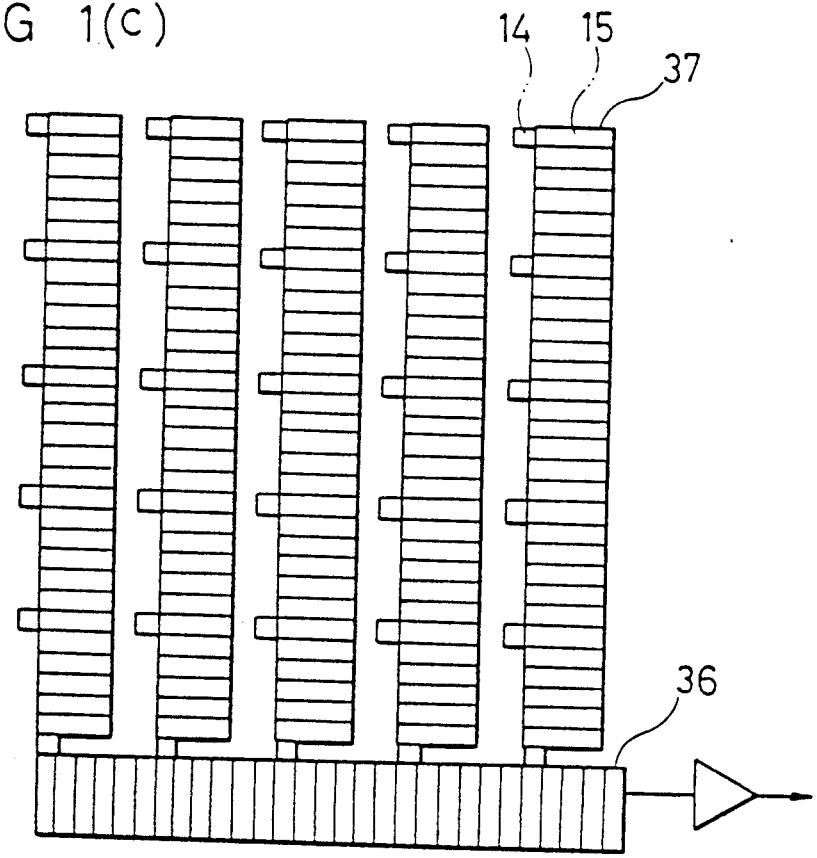
FIG. 1(c) is a schematic plan view of a two-dimensional light detecting array embodiment according to the invention.
Figure 1D:
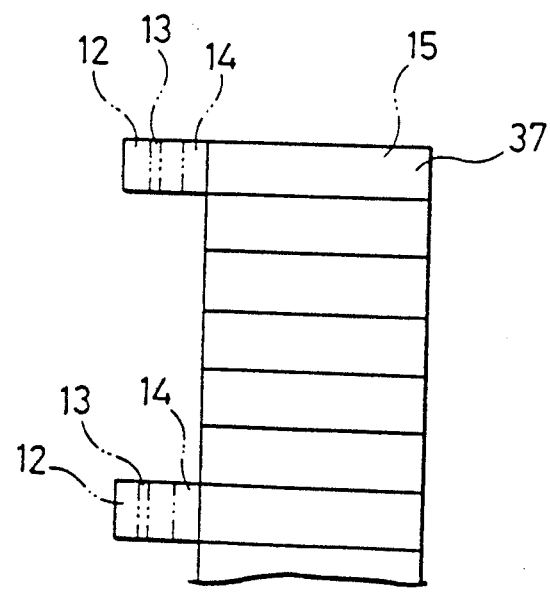
FIG. 1(d) is a detail view of a portion of the array of FIG. 1(c).

FIG. 1(a) shows a block diagram of a light detecting element according to an embodiment of the present invention. A sectional view of a representative portion of that light detecting element is shown in FIG. 1(b). A two-dimensional light detecting array employing a plurality of the elements of FIGS. 1(a) and 1(b) is shown schematically in FIG. 1(c). FIG. 1(d) shows a portion of the array of FIG. 1(c) in greater detail.

A light receiving substrate 30 includes photodiodes for converting incident light, particularly infrared light, into electrical signals, i.e., electrical charges. In a light detecting array responsive to infrared light, the substrate 30 may be a compound semiconductor, such as cadmium mercury telluride ($Cd_xHg_{1-x}Te$).

A signal processing circuitry substrate 1, disposed opposite light receiving substrate 30, comprises a multiple layer charge storage region 60 including layers 60a and 60b. Layers 60a and 60b are disposed on each other opposite substrate 30, forming part of a laminar structure. The substrate 1 also includes a charge transfer section 40 on which the layers 60a and 60b are disposed. The semiconductor material portions of the substrate 1 and the charge storage region 60 may all be silicon. The charge transfer section 40 may include a CCD. The substrate 1, the charge storage region 60, and the charge transfer section 40 comprise signal processing circuitry 100. The signal processing circuitry 100 and light receiving substrate 30 are interconnected by conductors 50 to complete the light detecting element. The conductors 50 provide a path for conveying the charges from the light detecting element to the charge storage region 60.

In one embodiment, the substrate 1 is p-type silicon. The charge storage well electrodes 12a, charge dividing electrodes 13, skimming electrodes 14, and CCD electrodes 15 are disposed on substrate 1 and embedded in an electrically insulating film 25. The layer 60b, which is disposed on the substrate 1, comprises a first p-type silicon layer 1a and multiple electrodes 12b which are embedded in an electrically insulating film 25b. The layer 60a which, in this embodiment, is closer to the light receiving substrate 30 than the layer 60b, is a second p-type silicon layer 1b on which multiple charge transfer electrodes 12c and gate electrodes 11 are disposed. The electrodes 12c and 11 are embedded in an electrically insulating film 25c.

Figure 2A:
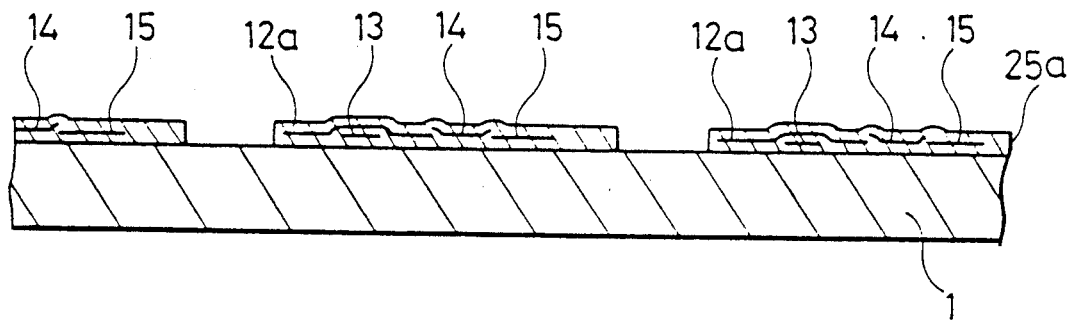
FIGS. 2(a) to 2(e) are sectional views illustrating a process for producing the embodiment of the invention shown in FIGS. 1(a) to 1(d).
Figure 2:
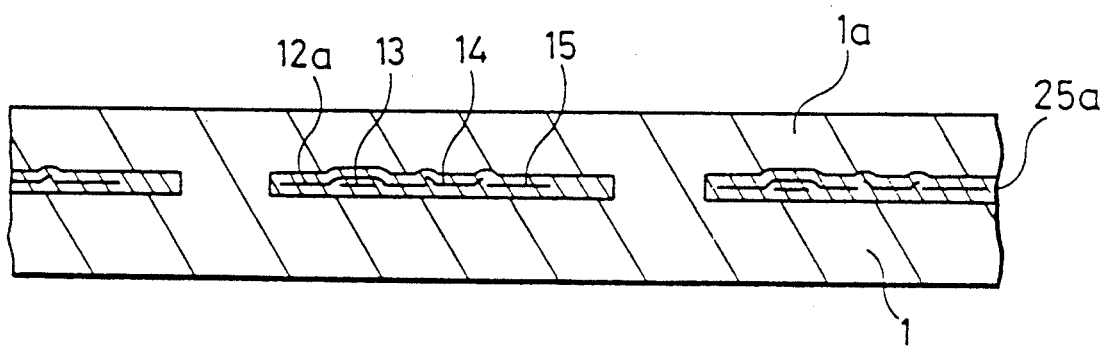

The process for producing the structure of FIG. 1(b) includes a number of successively performed steps. As illustrated in FIG. 2(a), a plurality of first charge storage well electrodes 12a, charge dividing electrodes 13, skimming electrodes 14, and CCD electrodes 15 are deposited on the p-type silicon substrate 1 and embedded in an electrically insulating film 25a to produce the charge transfer section 40.

The insulating layer 25a and the electrodes are not deposited in a single step. Instead, an initial portion of the insulating layer 25a is deposited, followed by the deposition of the charge dividing electrodes 13. Those electrodes are formed into a desired pattern. Thereafter, another portion of insulating layer 25a is deposited, followed by the deposition of charge storage electrodes 12a, skimming electrodes 14, and CCD electrodes 15. After patterning of the electrodes, the remaining portion of the insulating layer 25a is deposited. Portions of the insulating layer 25a are then removed to leave the pattern shown in FIG. 2(a) in which a plurality of spaced apart islands, each containing one electrode 12, 13, 14, and 15, are formed. The groups of electrodes are laterally repeated, as shown in FIG. 2(a), to form part of a linear light detecting array. In a two-dimensional detector array, the pattern is repeated in two, usually orthogonal, e.g., x and y, directions. The geometric relationship of the electrodes is as shown in FIG. 2(a) so that charges generated by a light signal that reach the charge transfer section 40 can be transferred between electrodes, to the right in FIG. 2(a), divided, skimmed, and further transferred.

Figure 2C:
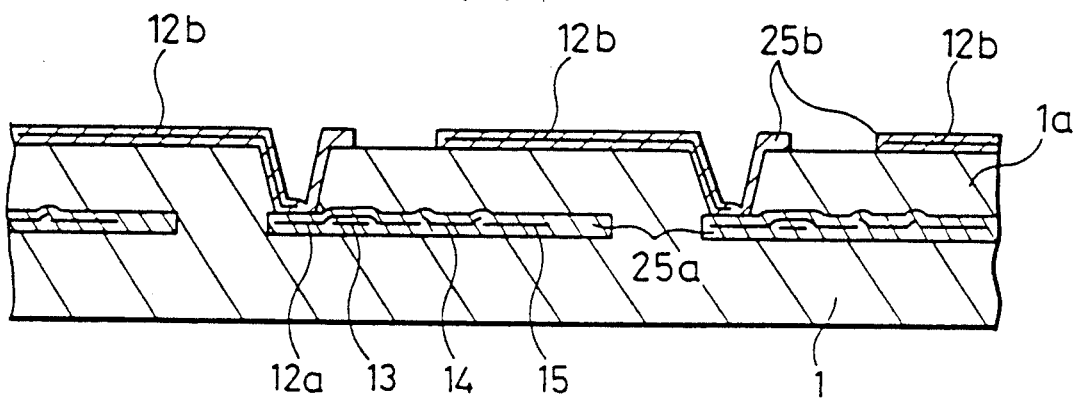

The first p-type silicon layer 1a is grown on the entire exposed surface of substrate 1 and the insulating islands containing the electrodes, as shown in FIG. 2(b). Using conventional photolithography and etching techniques, portions of silicon layer 1a opposite charge storage electrodes 12a are removed, but the insulating film 25a covering the electrodes 12a is left in place. An electrically insulating film 25b containing the second charge storage well electrodes 12b is deposited. A first portion of film 25b is deposited, followed by the deposition and patterning of the second storage well electrodes 12b. The final portion of film 25b is deposited over electrodes 12b and patterned to produce the structure shown in FIG. 2(c). The patterning of the insulating film 25b includes separation of the film into mutually isolated islands, as shown in FIG. 2(c). One of the ends of each of the second charge storage electrodes 12b, after passing through the layer 1a, is aligned opposite a respective charge storage electrode 12a. Thereby, each charge storage electrode 12b is serially and electrostatically connected to a respective charge storage electrode 12a for the flow of charges between potential wells formed opposite those electrodes. Thus, signal charges in the charge storage layer 60b can be transferred to the charge transfer section 40. In the embodiment of FIGS. 2(a) to 2(e), the serially interconnected charge storage electrodes 12a and 12b (and 12c) are laterally displaced from each other in the laminated structure. In other words, the directly interconnected electrodes lie side-by-side rather than being aligned with a direction generally perpendicular to substrate 1. The processing steps illustrated in FIG. 2(c) complete the charge storage layer 60b.

Figure 2D:
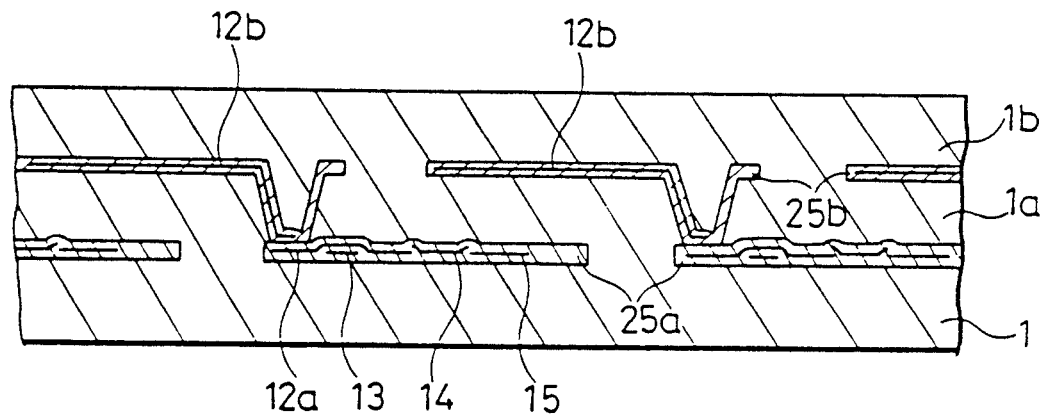

The steps illustrated in FIGS. 2(c) and 2(b) are repeated to form the charge storage layer 60a. The second p-type silicon layer 1b is grown over the exposed portions of layer 1a and the electrically insulating film 25b, as illustrated in FIG. 2(d). Using conventional photolithography and etching techniques, windows are opened in silicon film 1b, reaching the ends of the islands of the insulating films 25b of the charge storage electrodes 12b that are remote from the charge storage electrodes 12a. The charge storage electrodes 12c embedded in electrically insulating films 25c are produced in the same manner as used in forming the embedded electrodes 12a, 13, 14, and 15.

The end of the electrode 12c that is deposited in the window extends through the layer 1b and is opposite one end of the electrode 12b. Those opposed embedded electrodes 12c and 12b are thus electrostatically interconnected in series so that charges can freely flow in the potential wells formed opposite the electrodes. The gate electrodes 11 are formed at the same time as are third storage electrodes 12c and are also embedded in the insulating films 25c. The gate and third charge storage electrodes 11 and 12 are electrically isolated from each other by the removal of a part of the metal that was deposited to form both electrodes. Each of the gate electrodes 11 is remote from the end of the respective charge storage electrode 12c that is opposite the electrode 12b and is adjacent the other end of the respective island of the insulating film 25c.

Figure 2E:
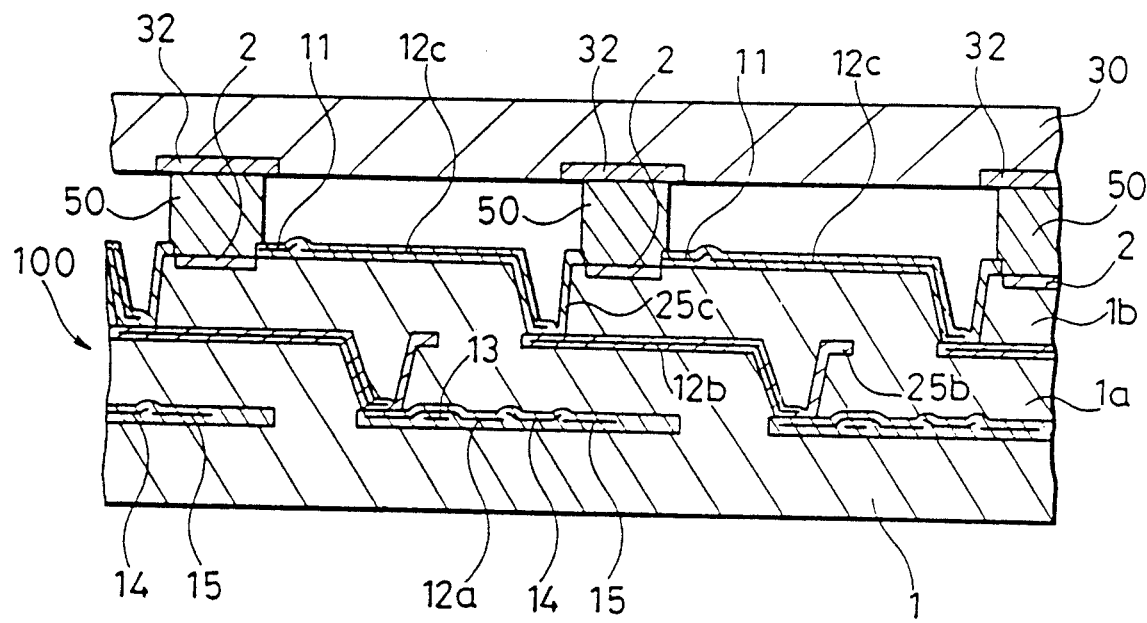

As in the other layers, the insulating film 25c is divided into spaced apart islands with the underlying semiconductor layer 1b exposed between the islands. In those exposed areas between the isolated islands of the insulating film 25c, n+-type connection regions 2 are formed in the silicon layer 1b. The formation of the n+-type regions 2 completes the elements of the signal processing circuitry 100, as shown in FIG. 2(e). The light receiving substrate 30 includes an array of photodiodes geometrically arranged to align with the n+-type connection regions 2 in the silicon layer 1b. The substrate 30 and its photodiodes are interconnected with the layer 1b through electrically conducting connections 50, as shown in FIG. 2(e). The electrically conductive connections 50, which may be bodies of indium, provide a means for conveying signal charges from the photodiodes to the signal processing circuitry. By operation of the gate electrodes 11, charges that flow from the photodiodes can be transferred to the potential well opposite the serially, electrostatically interconnected charge storage electrodes 12a and 12c, i.e., from the exposed surface of the layer 1b, through the interface between the layers 1b and 1a to the interface between the substrate 1 and the layer 1a.

The operation of one light detecting element is described below with the understanding that each element in a two-dimensional array is similarly operated. In the first step of operation, a relatively high voltage is applied to the charge storage electrodes 12a to 12c to produce a depletion region, i.e., a charge storage potential well 3, opposite each of those serially interconnected electrodes in the underlying silicon layers and substrate 1b, 1a, and 1, respectively. The charge storage well is continuous through the laminated structure opposite the charge storage electrodes 12a to 12c. A still higher voltage is applied to the gate electrode 11, producing a charge inversion region in the portion of silicon layer 1b opposite gate electrode 11. Electrical charges, i.e., the signal charges, from the photodiodes in substrate 30 flow through the inversion layer into the charge storage potential well 3 opposite the charge storage electrodes 12c to 12a.

Subsequently, a relatively low voltage is applied to the dividing electrode 13 so that the charge potential well and the stored charge opposite the electrode 12a is divided into two parts. Thereafter, a relatively high voltage is applied to the skimming electrode 14 and charges are "skimmed" from those stored in the portion of the divided potential well that is closer to the skimming electrode 14. The stored charges having a potential higher than the barrier opposite the skimming electrode 14 flow into the CCD potential well region opposite the CCD electrode 15.

Finally, a relatively high voltage is applied to the dividing electrode 13 so that the potential barrier opposite electrode 13 disappears. A voltage is applied to the gate electrode 16, shown in FIG. 9, of an FET, not shown in FIGS. 1(a)–1(d), to drain the stored charge from the potential well opposite electrodes 12a to 12c, and reset the element for sensing a subsequent light signal.

The mode of operation for a light detecting element of the type shown in FIGS. 1(a), 1(b), and 1(d) is sequentially repeated in a two-dimensional array of the type shown in FIGS. 1(c) and 1(d). A two-dimensional light detecting array includes at least two columns of light detecting elements with at least two elements in each column. The two-dimensional array of FIG. 1(c) includes five columns of light detecting elements with five light detecting elements in each column. The collected charges from each element are transferred, usually simultaneously, to a CCD in the connected column 37 of CCDs. Those charges are transferred along the column 37 of CCDs sequentially to reach the connected row 36 of CCDs. The CCDs in row 36 transfer the collected charges sequentially to external circuitry for further processing. A two-dimensional image is electronically represented by the collected charges since each group of charges represents a light intensity at an area in the array. The timing of charge collection provides information on the position at which the particular charges were produced in response to the incident light. That positional information is employed to represent the image. The terms "columns" and "rows" as used herein are interchangeable and merely refer to alignments of detecting elements and particularly CCDs along two different directions. The essential part of a light detecting array is the collection of signals from a plurality of points over an area, i.e., along a line which need not be straight or over a matrix of points lying along at least two lines.

In the light detecting element and array described, a very large charge storage capacity is achieved. The potential wells created during operation are indicated schematically in FIG. 1(b) by a dash and dot line. That line indicates the presence of an inversion layer opposite gate 11, the charge storage potential wells opposite the charge storage electrodes 12a to 12c, a potential well division opposite the dividing electrode 13, and a skimming potential barrier opposite the skimming dividing electrode 14. Because the charge storage potential well extends under electrodes 12c, 12b, and 12a, it has a much larger area than the conventional single layer detector elements described with respect to FIG. 9. The increased electrode area increases the charge storage capacity, but the laminated three-dimensional structure does not increase the overall area of the element, i.e., the substrate 1, over that of the prior art device schematically shown in FIG. 9.

The increased charge storage capacity of light detecting elements according to the invention improves their signal-to-noise ratio. The separation of functions between the signal processing circuitry 100 and the charge storage region 60 makes it possible to enlarge the charge storage capacity without reducing the area of the other parts of the element. It is particularly apparent from FIG. 1(b) that the potential well signal processing operations, i.e., the division of the potential well and the skimming of charges, all take place in the substrate 1, a relatively high quality crystalline semiconductor material. The only operations in the grown layers 1a and 1b, which are normally of somewhat lower electronic quality than substrate 1, are charge storage and flow. Thus, element performance is not significantly adversely affected by defects in the grown layers 1a and 1b. The charge storage capacity and the signal-to-noise ratio can be further improved, if necessary, by increasing the number of laminations, i.e., the number of charge storage layers and electrodes. The increased charge storage capacity means that precise positioning of the dividing electrodes 13 relative to the storage electrodes 12a is not necessary and that the quantity of charges transferred to the CCD can be easily controlled.

Figure 7B:
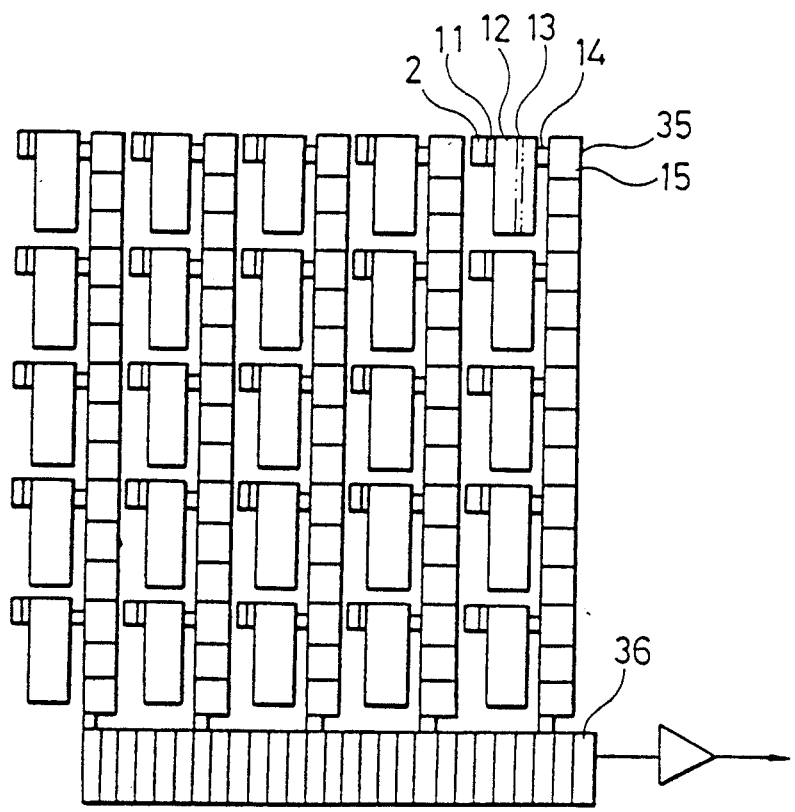
FIG. 7(b) is a schematic plan view of a two-dimensional detector array according to the prior art.
Figure 8:
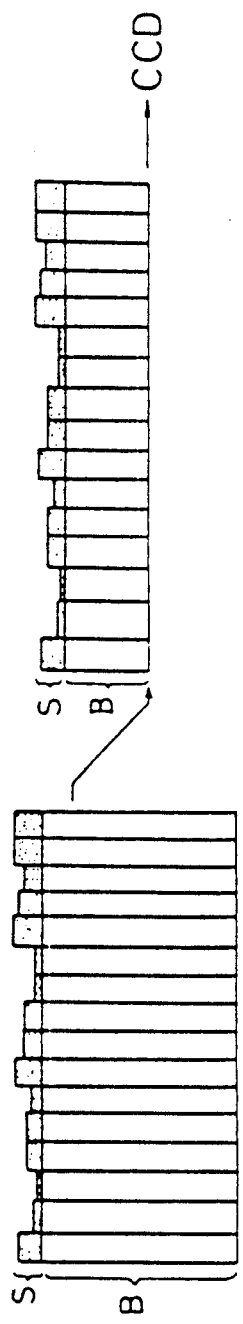
FIG. 8(a) illustrates the charge skimming method.
FIG. 8(b) illustrates the variation in the quantity of charge stored with different integration times.
Figure 8:
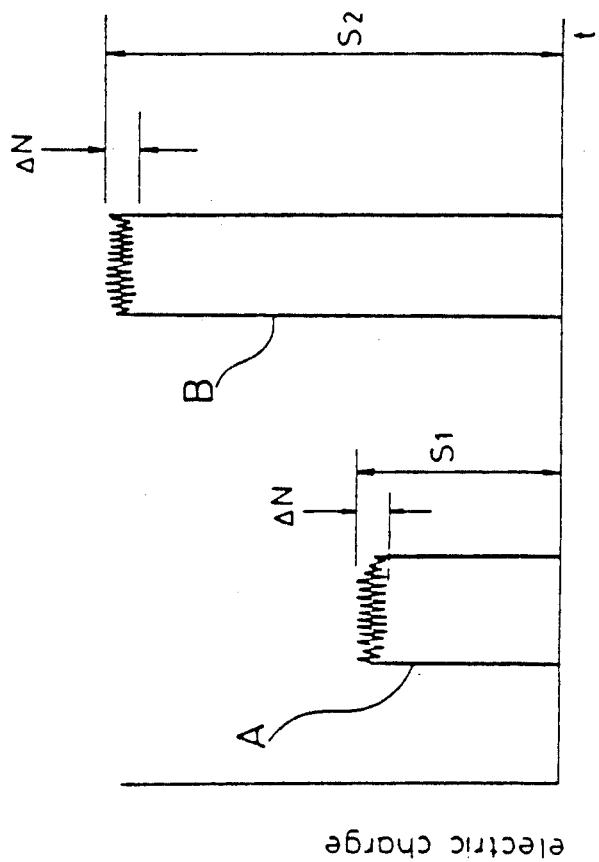
Figure 9A:
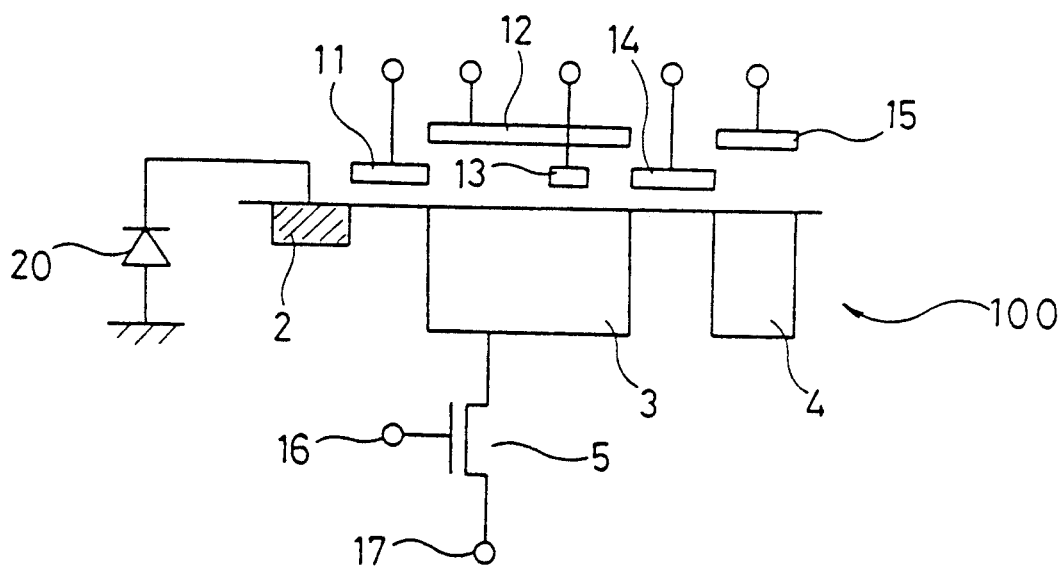
FIGS. 9(a) to 9(d) illustrate the charge storage and transfer operation of a prior art infrared detector.
Figure 9B:
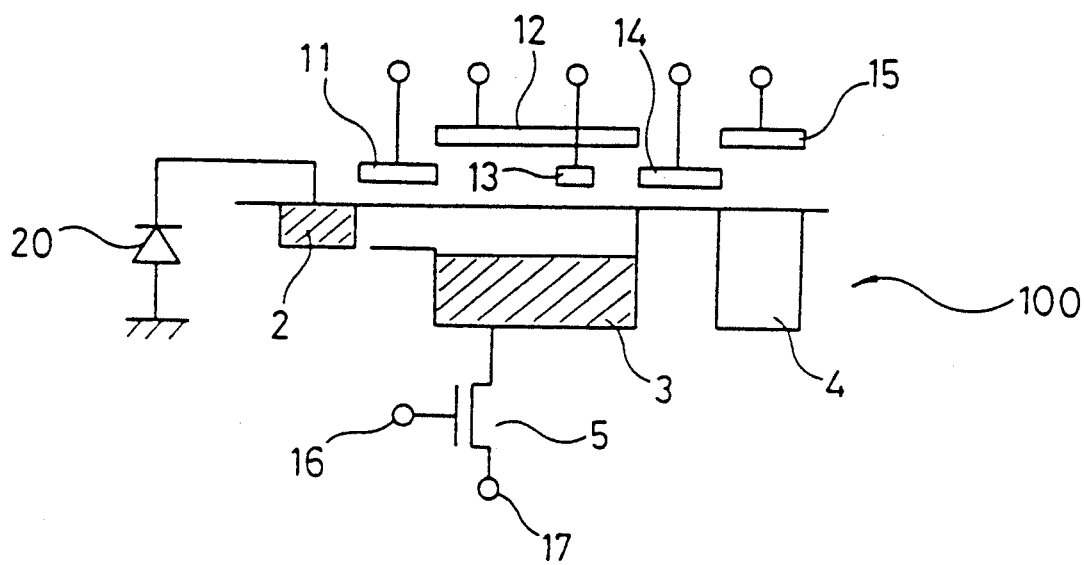
Figure 9C:
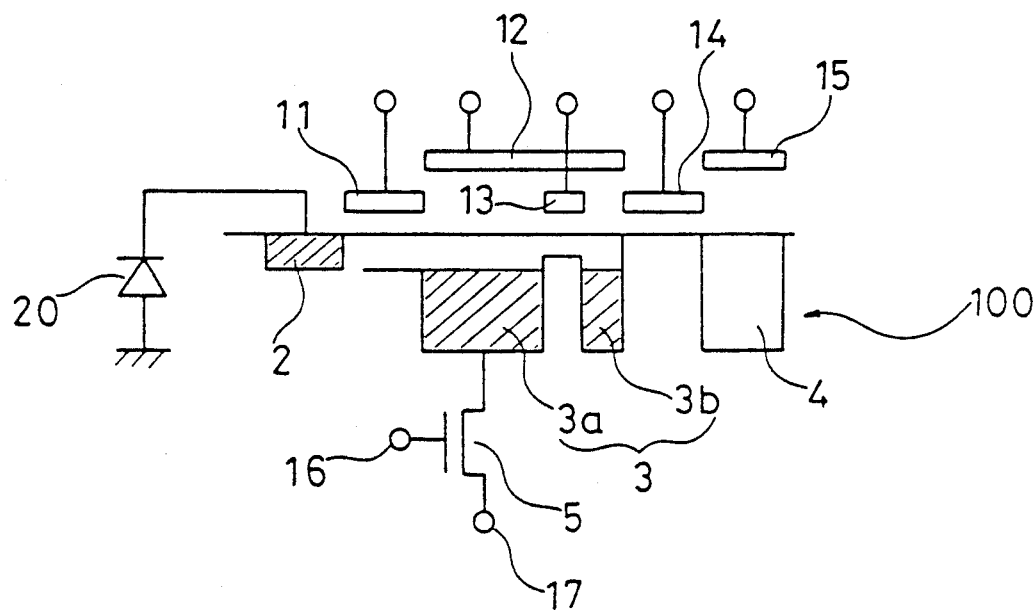
Figure 9D:
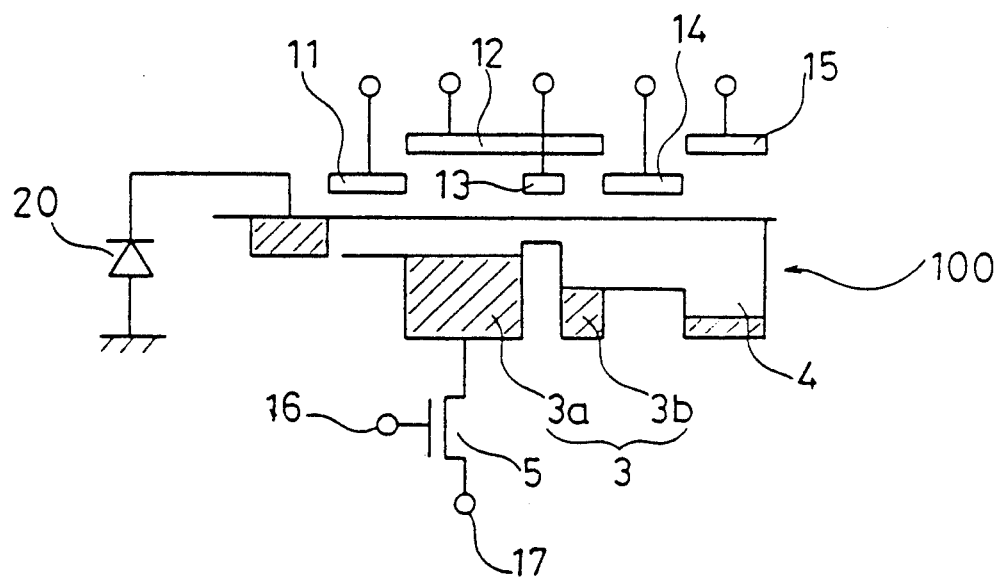
Figure 10:
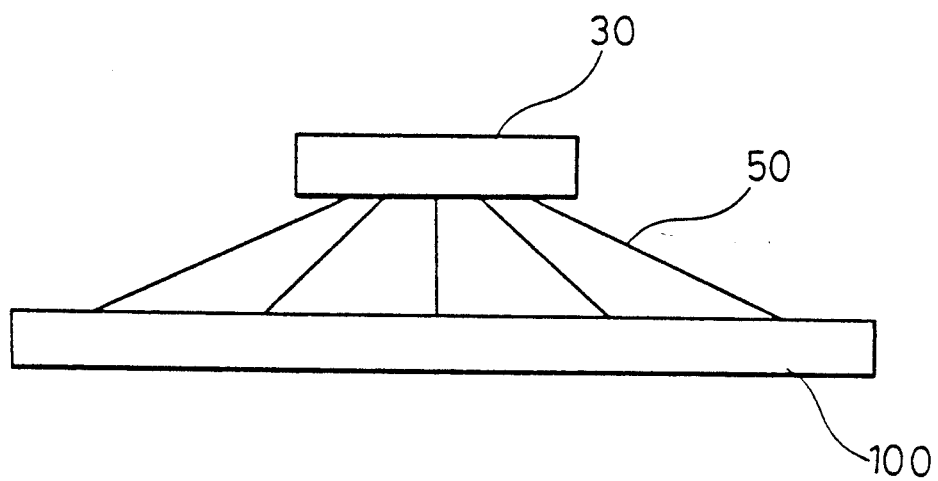
FIG. 10 is a schematic diagram of a prior art hybrid infrared detector.

Two-dimensional images having good contrast, as in example B of FIG. 8(b), can be obtained by skimming the signal charges produced in response to light from a low contrast source, as indicated in FIG. 8(a). Unlike the prior art device of FIG. 7(b), in a two-dimensional array according to the invention almost all of the charge transfer section 40 can be used for the CCD, as indicated in FIG. 1(d). Thus, for a particular size array, the size of the CCD and, therefore, its charge transfer dynamic range, can be increased in an embodiment of the invention compared to the prior art devices. In addition, the constraints on the aspect ratio of the CCD are relaxed. The CCD electrode can be narrowed in the direction of charge transfer within the light detecting element and lengthened in the perpendicular direction thereto, i.e., in the directions of row 36 and column 37, respectively, of FIG. 1(c). This change in aspect ratio increases the charge transfer speeds compared to prior art CCDs having the same charge storage capacity.

Figure 7A:
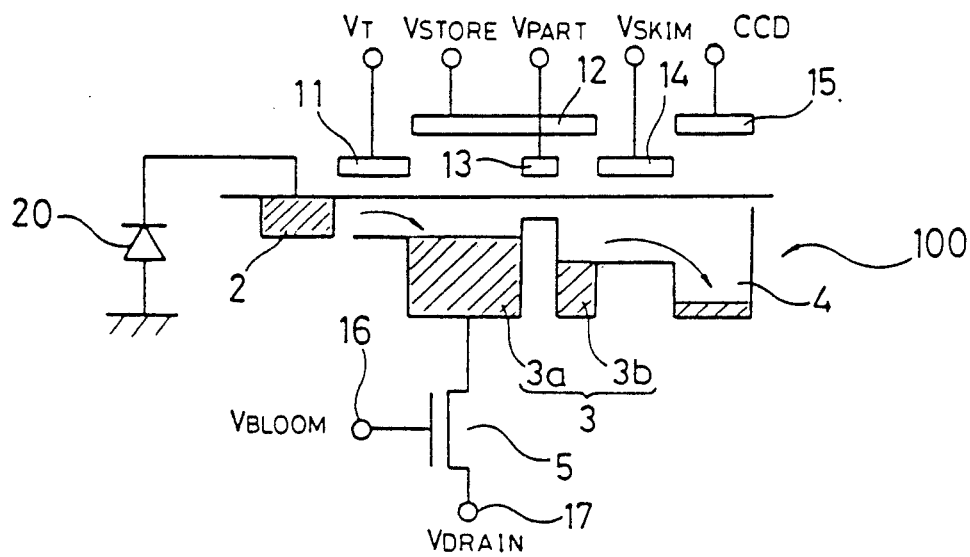
FIG. 7(a) is a schematic diagram illustrating the operation of a prior art infrared detector employing charge skimming.

The increased dynamic range of the CCD permits a larger quantity of electrical charges to be transferred in a two-dimensional array according to the invention. Thus, the CCD can be operated with each light detecting element providing information corresponding to the intensity of light emitted from a particular area of a radiating body. The improved dynamic range means that use of a charge sweep device (CSD) or method may be avoided. In the CSD system, the signal charges produced by the photoresponsive elements in a column of an array, like column 37 of FIG. 7(c), are summed to provide an output signal. While the summed signals improve the amplitude of the signal compared to the background, the CSD system is slow since all photoresponsive elements are operated simultaneously, followed by the sweeping step.

The novel array provides a higher speed of operation by avoiding a summing step. The summing step is not needed in the invention since the quantity of signal charges stored and transferred in each light detecting element is much larger than in the prior art devices This higher speed means that a real time, i.e., relatively high speed, image of a radiating body can be formed rather than the "slow scan" image obtained in a CSD system. The CSD mode of operation can also be employed with two-dimensional arrays according to the invention, further increasing the dynamic range of the novel arrays at a cost to the speed of operation. Charge skimming is important in the CSD mode of operation to avoid overflow of signal charges from the potential wells.

The embodiment of the apparatus described employs only a single skimming electrode. A plurality of skimming electrodes may be employed to improve the signal-to-noise ratio and in situations where a relatively large number of signal and background charges are expected to be produced. Those additional skimming electrodes may be disposed in the charge storage region 60 which may be divided into a number of sections. For example, as schematically indicated in FIG. 3(a), a separate skimming electrode may be employed with each of first to third charge storage sections 21a to 22c. Those charge storage sections are connected in series. Turning to FIG. 3(b), skimming electrodes 14a to 14c are shown in a representative sectional view of a light detecting element according to the invention. Skimming electrodes 14b and 14c have been added to the structure shown in FIG. 1(b). These skimming electrodes divide charge storage electrodes 12b and 12c into portions $12b_1$, $12b_2$, and $12c_1$, $12c_2$, respectively. The additional skimming electrodes 14b and 14c are operated sequentially to transfer only part of the charges stored in the potential well opposite the respective preceding charge storage electrodes, i.e., $12c_2$, and $12c_1$ plus $12b_2$, respectively. The skimming electrode 14a also skims charges but only from a portion of the divided potential well opposite the charge storage electrode 12a.

Figure 4A:
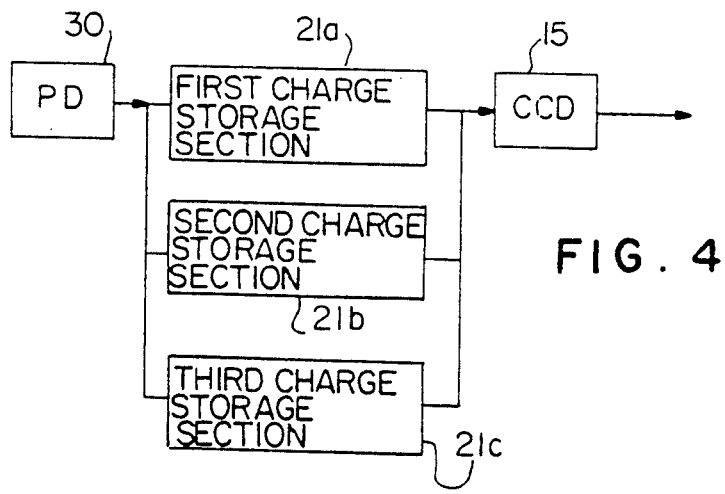
FIG. 4(a) is a block diagram illustrating yet another embodiment of the present invention.
Figure 4B:
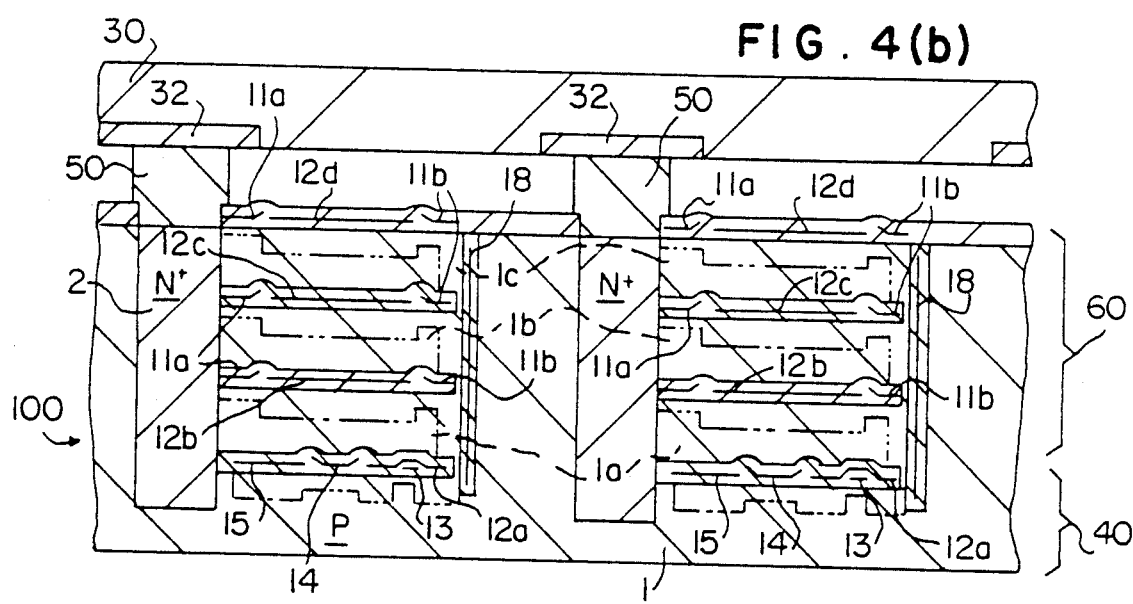
FIG. 4(b) is a sectional view of a representative portion of the embodiment of FIG. 4(a).
Figure 5:
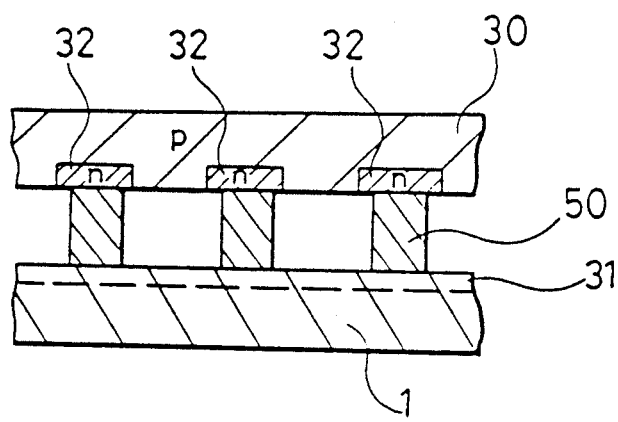
FIG. 5 is a cross-sectional view showing the general structure of a prior art infrared detector array.
Figure 6A:
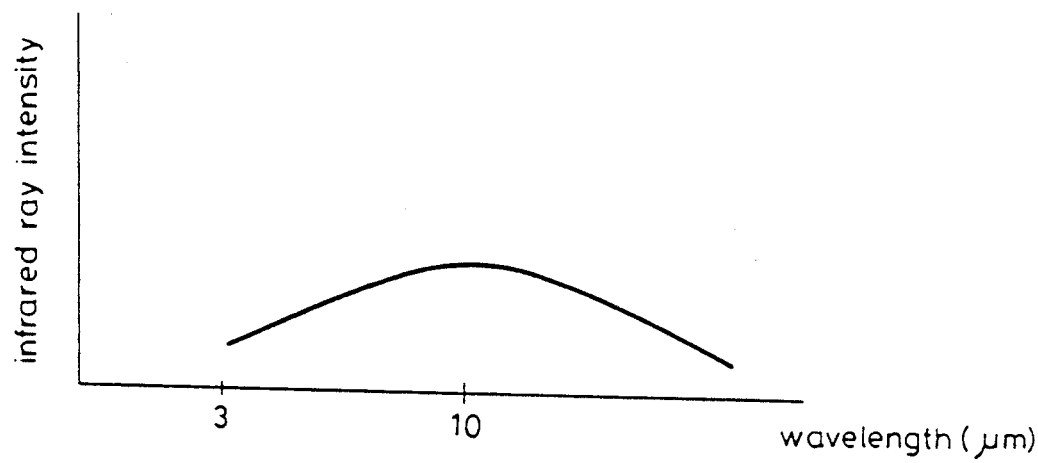
FIG. 6(a) is a graph of infrared light radiation from a black body as a function of wavelength.
Figure 6B:
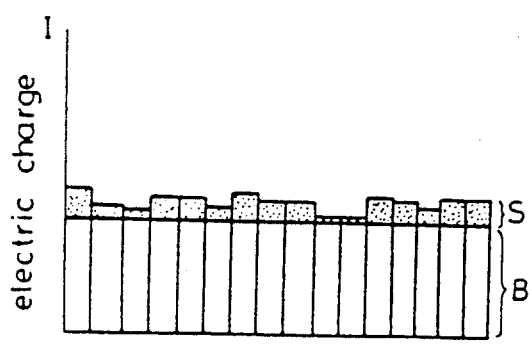
FIGS. 6(b) and 6(c) are graphs illustrating the background and desired signal intensities produced by infrared detectors as a function of wavelength for two different wavelength bands.
Figure 6C:
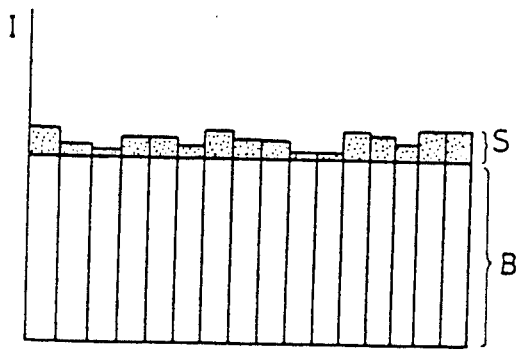

As illustrated in FIGS. 4(a) and 4(b), the charge storage sections 21a to 21c may also be electrostatically interconnected in parallel. In the embodiment illustrated in FIGS. 4(a) and 4(b), each element includes charge storage well electrodes 12a to 12d which are successively stacked or laminated opposite each other rather than being laterally disposed relative to each other within the laminated silicon layers. First and second gate electrodes 11a and 11b are disposed at opposite ends of each of the charge storage electrodes 12b to 12d. A charge transfer electrode 18 is disposed transverse to the electrodes 12a to 12c at the gate electrodes 11b, opposite the gate electrodes 11a and the n+-type connection region 2. That connection region in this embodiment extends through the laminated layers to p-type substrate 1 to achieve the parallel connection of the charge storage electrodes 12a to 12d. (The series interconnection of FIG. 1(b) requires the connection region 2 to reach only the nearest charge storage electrode 12c.)

With the embodiment of FIG. 4(b), the first gate electrodes 11a are initially turned on, i.e., an inversion layer is created opposite the electrodes for the transfer of charges to the respective charge storage electrodes.

Signal charges produced by incident light are conducted through the connection region 2 and flow through the inversion layers opposite the gate electrodes 11a into the potential wells beneath the charge storage electrodes 12b–12d. When the gate electrodes 11b are turned on, creating inversion layers, the stored charges from the potential wells opposite electrodes 12b to 12d flow, by means of the charge transfer electrode 18, to a potential well opposite electrode 12a. Those charges are subsequently transferred to the potential well opposite the CCD electrode 15 employing the steps already described with respect to the embodiment of FIG. 1(a). In other words, the charges stored opposite the charge storage electrode 12a are divided by the dividing electrode 13. Signal charges are skimmed from one of the parts of the divided potential well through the skimming electrode 14 and transferred to the CCD electrode 15. The potential wells are indicated in FIG. 4(b) by the dash and dot lines drawn opposite the respective electrodes. The parallel connection of the charge storage electrodes results in a summing of the stored charges, enhancing the signal contrast.

The advantages of speed and improved signal-to-noise ratio achieved in the structure of FIG. 1(a) to 1(d) are obtained in the embodiments of FIGS. 3(b) and 4(b) if the charge quantities stored in each of the respective charge storage sections are equal. In either embodiment, the quantities of charge stored can be made relatively large compared to the prior art detectors. In any of the embodiments, the quantity of charge stored may result in a larger than desired charge flow into the CCD electrode 15. That result can be avoided by employing multiple charge storage well dividing electrodes 13. In such a structure, the quantity of charge in the portion of the divided well that is subjected to skimming by the skimming electrode 14 may be a smaller fraction of the collected charge than would be provided if only a single dividing electrode 13 is employed. The use of multiple dividing electrodes 13 permits the quantity of collected charge presented to the skimming electrode 14 to be arbitrarily chosen as a particular fraction of the total collected charge.

Although the embodiments described employ a compound semiconductor, such as CdHgTe as the light responsive material, separated from a silicon substrate and layers functioning as the charge storage region and transfer section, other semiconductor materials may be employed in these parts of the light detecting element and arrays of elements.

I claim:

1. A light detecting element comprising:
light responsive means for generating electrical charges in response to incident light;
charge storage means including at least first and second charge storage electrodes for storing the charges;
means for conveying the charges from said light responsive means to said charge storage means; and
charge transfer means including charge transfer electrodes for transferring at least a portion of the stored charges from said charge storage means to a charge coupled device electrode wherein said charge storage means comprises a semiconductor substrate on which at least a first layer of a semiconductor material is disposed, said first charge storage electrode and said charge transfer electrodes are disposed between said substrate and said first layer, and said second charge storage electrode is disposed on said first layer opposite said substrate and is interconnected to said first charge storage electrode.

2. The light detecting element of claim 1 including a second layer of the semiconductor material disposed on said first layer opposite said substrate and a third charge storage electrode interconnected to said second charge storage electrode and disposed on said second layer opposite said first layer, said second charge storage electrode being disposed between said first and second layers.

3. The light detecting element of claim 2 wherein said first, second, and third charge storage electrodes are aligned with each other and including a charge transfer electrode disposed transverse to and interconnecting said first, second, and third charge storage electrodes for transferring charges stored at potential wells opposite said second and third charge storage electrodes to a potential well opposite said first charge storage electrode.

4. The light detecting element of claim 3 including a pair of gate electrodes connected in series with each of said second and third charge storage electrodes for respectively controlling the flow of charges from the light responsive means into potential wells opposite the respective second and third charge storage electrodes and from the respective second and third charge storage electrodes to a potential well opposite said first charge storage electrode.

5. The light detecting element of claim 2 wherein said charge transfer means comprises charge dividing means for dividing the charges stored in said charge storage means into at least two parts and charge skimming means for transferring charges having energies exceeding a preselected potential barrier from one of the parts of the divided charges in said charge storage means to a potential well opposite said charged coupled device electrode.

6. The light detecting element of claim 5 wherein said charge skimming means comprises a skimming electrode disposed between said first charge storage electrode and said charge coupled device electrode and between said substrate and said first layer.

7. The light detecting element of claim 5 wherein said charge dividing means comprises a dividing electrode disposed opposite said first charge storage electrode and said substrate and between said substrate and said first layer.

8. The light detecting element of claim 2 wherein said first, second, and third charge storage electrodes are laterally displaced from each other and are interconnected in series.

9. The light detecting element of claim 1 wherein said first and second charge storage electrodes are laterally displaced from each other and are interconnected in series.

10. The light detecting element of claim 1 wherein said light responsive means comprises a semiconductor diode.

11. The light detecting element of claim 10 wherein said diode is responsive to infrared light.

12. The light detecting element of claim 10 wherein said semiconductor diode is disposed in a second semiconductor substrate and said means for conveying comprises an electrically conductive material disposed between and interconnecting said first layer and said second substrate.

13. The light detecting element of claim 1 wherein said charge transfer means comprises charge dividing means for dividing the charges stored in said charge storage means into at least two parts and charge skimming means for transferring charges having energies exceeding a preselected potential barrier from one of the parts of the divided charges of said charge storage means to a potential well opposite said charge coupled device electrode.

14. The light detecting element of claim 13 wherein said charge skimming means comprises a skimming electrode disposed between said first charge storage electrode and said charge coupled device electrode and between said substrate and said first layer.

15. The light detecting element of claim 14 including a second skimming electrode interconnected in series between said first and second charge storage electrodes.

16. The light detecting element of claim 13 wherein said charge dividing means comprises a dividing electrode disposed opposite said first charge storage electrode and said substrate and between said substrate and said first layer.

17. The light detecting element of claim 13 wherein said charge storage well dividing means and said charge skimming means comprise dividing and skimming electrodes disposed between said substrate and said first layer and wherein said first and second charge storage, dividing, skimming, and gate electrodes are embedded an electrically insulating film.

18. The light detecting element of claim 1 including a gate electrode interconnected in series between said light responsive means and said charge storage means for controlling the flow of charges from said light responsive means to said charge storage means.

19. The light detecting element of claim 1 wherein said first and second charge storage electrodes are embedded in an electrically insulating film.

20. A two-dimensional light detecting array comprising at least two columns of light detecting elements, each column including at least two light detecting elements, a column charge coupled device interconnected with the light detecting elements in a respective column for transferring charges from said light detecting elements in the respective column and a row charge coupled device interconnected with said column charge coupled devices for collecting the charges transferred by each column charge coupled device and transferring the collected charges to external circuitry for forming a two-dimensional image of a radiating body wherein each of said light detecting elements comprises:
light responsive means for generating electrical charges in response to incident light;
charge storage means including at least first and second charge storage electrodes for storing the charges;
means for conveying the charges from said light responsive means to said charge storage means; and
charge transfer means including charge transfer electrodes for transferring at least a portion of the stored charges from said charge storage means to the respective interconnected column charge coupled device wherein said charge storage means comprises a semiconductor substrate on which at least a first layer of a semiconductor material is disposed, said first charge storage electrode and said charge transfer electrodes are disposed between said substrate and said first layer, and said second charge storage electrode is disposed on said first layer opposite said substrate and interconnected to said first charge storage electrode.

21. The light detecting array of claim 20 wherein said light detecting elements are spaced apart from each other and each of said elements employs a common substrate and common first layer.

22. The light detecting array of claim 21 including a second layer of the semiconductor material disposed on said first layer opposite said substrate and wherein each said light detecting element includes a third charge storage electrode interconnected to said second charge storage electrode and disposed on said second layer opposite said first layer, said second charge storage electrode being disposed between said first and second layers.

23. The light detecting array of claim 22 wherein said first, second, and third charge storage electrodes of each light detecting element are aligned with each other and each said light detecting element includes a charge transfer electrode disposed transverse to and interconnecting said first, second, and third charge storage electrodes for transferring charges stored at potential wells opposite said second and third charge storage electrodes to a potential well opposite said first charge storage electrode.

24. The light detecting array of claim 23 wherein each said light detecting elements includes a pair of gate electrodes connected in series with each of said second and third charge storage electrodes for respectively controlling the flow of charges from the light responsive means into potential wells opposite the respective second and third charge storage electrodes and from the respective second and third charge storage electrodes to a potential well opposite said first charge storage electrode.

25. The light detecting array of claim 22 wherein said charge transfer means of each said light detecting element comprises charge dividing means for dividing the charges stored in said charge storage means into at least two parts and charge skimming means for transferring charges having energies exceeding a preselected potential barrier from one of the parts of the divided charges in said charge storage means to a potential well opposite the respective interconnected column charged coupled device.

26. The light detecting array of claim 25 wherein said charge skimming means of each said light detecting element comprises a skimming electrode disposed between said first charge storage electrode and said respective interconnected column charge coupled device and between said substrate and said first layer.

27. The light detecting array of claim 25 wherein said charge dividing means of each said light detecting element comprises a dividing electrode disposed opposite said first charge storage electrode and said substrate and between said substrate and said first layer.

28. The light detecting array of claim 22 wherein said first, second, and third charge storage electrodes of each said light detecting element are laterally displaced from each other and are interconnected in series.

29. The light detecting array of claim 20 wherein said first and second charge storage electrodes of each said light detecting element are laterally displaced from each other and are interconnected in series.

30. The light detecting array of claim 20 wherein each said light responsive means comprises a semiconductor diode.

31. The light detecting array of claim 30 wherein each said diode is responsive to infrared light.

32. The light detecting array of claim 30 wherein each said semiconductor diode is disposed in a second semiconductor substrate and said means for conveying of each said light detecting element comprises an electrically conductive material disposed between said first layer and said second substrate.

33. The light detecting array of claim 20 wherein said charge transfer means of each said light detecting element comprises charge dividing means for dividing the charges stored in said charge storage means into at least two parts and charge skimming means for transferring charges having energies exceeding a preselected potential barrier from one of the parts of the divided charges of said charge storage means to a potential well opposite the respective interconnected column charge coupled device.

34. The light detecting array of claim 33 wherein said charge skimming means of each said light detecting element comprises a skimming electrode disposed between said first charge storage electrode and the respective interconnected column charge coupled device and between said substrate and said first layer.

35. The light detecting array of claim 34 wherein each of said light detecting elements includes a second skimming electrode interconnected in series between said first and second charge storage electrodes.

36. The light detecting array of claim 34 wherein said charge dividing means of each of said light detecting elements comprises a dividing electrode disposed opposite said first charge storage electrode and said substrate and between said substrate and said first layer.

37. The light detecting array of claim 33 wherein said charge dividing means and said charge skimming means of each of said light detecting elements comprise dividing and skimming electrodes disposed between said substrate and said first layer and wherein said first and second charge storage, dividing, skimming, and gate electrodes are embedded an electrically insulating film.

38. The light detecting array of claim 20 wherein each of said light detecting elements includes a gate electrode interconnected in series between said light responsive means and said charge storage means for controlling the flow of charges from said light responsive means to said charge storage means.

39. The light detecting array of claim 20 wherein said first and second charge storage electrodes of each of said light detecting elements are embedded in an electrically insulating film.

* * * * *